(12) United States Patent
Ramsbey et al.

(10) Patent No.: US 6,855,608 B1
(45) Date of Patent: Feb. 15, 2005

(54) METHOD OF FABRICATING A PLANAR STRUCTURE CHARGE TRAPPING MEMORY CELL ARRAY WITH RECTANGULAR GATES AND REDUCED BIT LINE RESISTANCE

(75) Inventors: Mark Ramsbey, Sunnyvale, CA (US); Mark W. Randolph, San Jose, CA (US); Jean Yee-Mei Yang, Sunnyvale, CA (US); Hiroyuki Kinoshita, Sunnyvale, CA (US); Cyrus Tabery, Santa Clara, CA (US); Jeff P. Erhardt, San Jose, CA (US); Tazrien Kamal, San Jose, CA (US); Jaeyong Park, Sunnyvale, CA (US); Emmanuil H. Lingunis, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 3 days.

(21) Appl. No.: 10/463,643

(22) Filed: Jun. 17, 2003

(51) Int. Cl.[7] ............................................. H01L 21/336
(52) U.S. Cl. ........................ 438/287; 438/121; 438/599; 438/261
(58) Field of Search ................................. 438/121, 599, 438/287

(56) References Cited

U.S. PATENT DOCUMENTS 6,524,913 B1 * 2/2003 Lin et al. ..................... 438/261

* cited by examiner

Primary Examiner—George Fourson
Assistant Examiner—Julio J. Maldonado
(74) Attorney, Agent, or Firm—Renner, Otto, Boisselle & Sklar, LLP (57) ABSTRACT

A method of fabricating a planar architecture charge trapping dielectric memory cell array with rectangular gates comprises fabricating a multi-layer charge trapping dielectric on the surface of a substrate. The layer adjacent to the substrate may be an oxide. A polysilicon layer is deposited over the charge trapping dielectric. A word line mask is applied over the polysilicon layer to mask linear word lines in a first direction and to expose trench regions there between and the trenches are etched to expose the charge trapping dielectric in the trench regions. A bit line mask is applied over the polysilicon layer to mask gates in a second direction perpendicular to the first direction and to expose bit line regions there between and the bit lines are etched to expose the oxide in the bit line regions. The bit lines are implanted and insulating spacers are fabricated on exposed sidewalls. The oxide is removed to expose the substrate between insulating spacers in the bit line regions and a conductor is fabricated thereon to enhance conductivity of each bit line.

24 Claims, 10 Drawing Sheets

METHOD OF FABRICATING A PLANAR STRUCTURE CHARGE TRAPPING MEMORY CELL ARRAY WITH RECTANGULAR GATES AND REDUCED BIT LINE RESISTANCE

TECHNICAL FIELD

The present invention relates generally to flash memory cell devices and more specifically, to reduction of bit line resistance in planar charge trapping dielectric memory cell structures.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

More recently charge trapping dielectric memory cell structures have been developed. A first embodiment, as represented by the cross section diagram of FIG. 1a, includes a bit line oxide structure. The cells 10a and 10b are fabricated on a semiconductor substrate 12. Each cell 10 is characterized by a vertical stack of an insulating tunnel layer 14 a charge trapping dielectric layer 20a, 20b, and a top dielectric layer 22a, 22b formed over channel regions 24a, 24b of the substrate 12. Such stack may be referred to as an ONO stack because the insulating tunnel layer 14 and the top dielectric layer 22 are typically an oxide while the center charge trapping dielectric layer 20 is typically a nitride compound. The channel regions 24 are separated from each other, and defined by, bitline implants 18a, 18b, and 18c within the substrate 12. The ONO stacks are separated from each other, and defined by bit line oxide regions 16a, 16b, and 16c which are areas of the tunnel dielectric layer 14 above the bit line implants 18 that are thicker than the areas of the tunnel dielectric layer 14 that are over the channel regions 24.

Figure 1A:
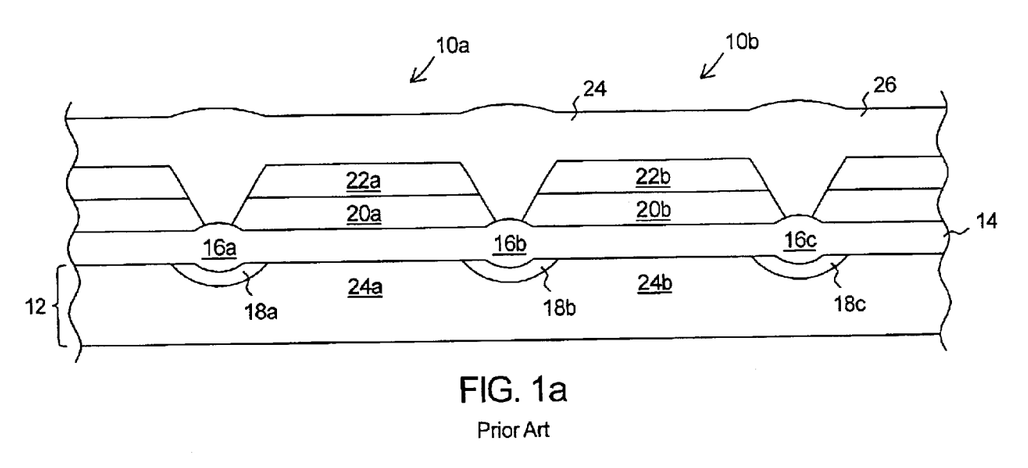
FIG. 1a is a schematic, cross sectional view of a portion of a row of charge trapping dielectric memory cells with a bit line oxide structure in accordance with the prior art.

Above the ONO stacks are a plurality of spaced apart polysilicon word lines 26 that are perpendicular to the bit line implants 18. Each word line is positioned above the top dielectric layer 22b of all cells within a row.

Similar to the floating gate device, the charge trapping dielectric memory cell 10 is programmed by inducing hot electron injection from the channel region 24 to the nitride layer 20 to create a non volatile negative charge within charge traps existing in the nitride layer 20. Again, hot electron injection can be achieved by applying a drain-to-source bias (e.g. bit line 18b to bit line 18a bias for programming cell 10a) along with a high positive voltage on the polysilicon word line 26 which forms a control gate over the cell 10a. The high voltage on the word line 26 inverts the channel region 24a while the drain-to-source bias accelerates electrons towards the drain bitline 18b. The accelerated electrons gain 5.0 to 6.0 eV of kinetic energy which is more than sufficient to cross the 3.2 eV Si—$SiO_2$ energy barrier between the channel region 24 and the tunnel oxide layer 14. While the electrons are accelerated towards the drain bitline 18b, those electrons which collide with the crystalline lattice are re-directed towards the Si—$SiO_2$ interface under the influence of the control gate electrical field and have sufficient energy to cross the barrier.

Because the charge trapping layer 20 layer stores the injected electrons within traps and is otherwise a dielectric, the trapped electrons remain localized within a charge storage region that is close to the drain region bit line to which the positive voltage was applied. As such, the charge trapping dielectric memory device can be used to store two bits of data, one near each of the bit lines of each cell.

The array is typically fabricated by first applying the ONO layer to the top surface of the substrate, etching back the ONO layer to the top surface of the substrate in the bit line regions, implanting the bit line regions, oxidizing the bit line regions to form the bit line oxides, and then applying the word lines to the top of the remaining ONO layer and the bit line oxides.

Figure 1B:
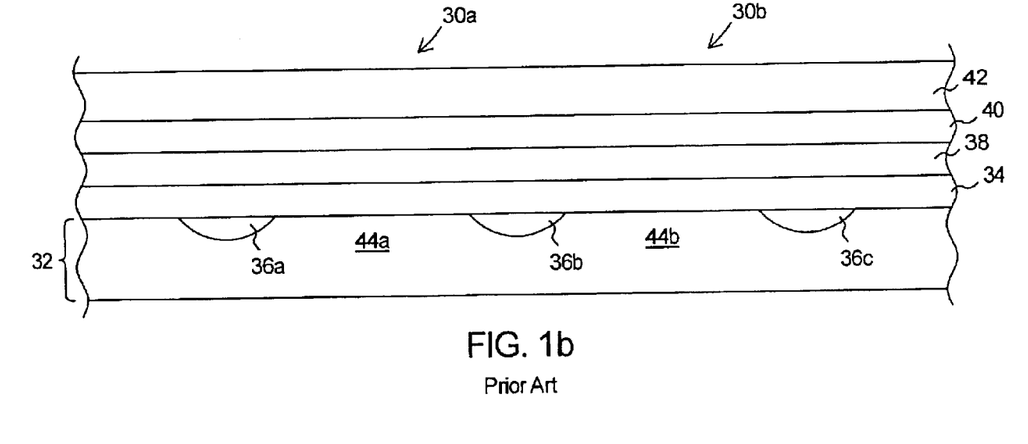
FIG. 1b is a schematic, cross sectional view of a portion of a row of charge trapping dielectric memory cells with a planar structure in accordance with the prior art.

A second embodiment of a charge trapping dielectric memory cell structure is a planar structure as represented by the diagram of FIG. 1b. Cells 30a and 30b are fabricated on a semiconductor substrate 32. Positioned over the semiconductor substrate 32 is a vertical stack of an insulating tunnel layer 34 a charge trapping dielectric layer 38, and a top dielectric layer 40 positioned over the substrate 32.

Within the substrate are a plurality of parallel, and spaced apart, bit line implants 36a, 36b, and 36c which define a plurality of channel regions 44a, 44b, each of which is between adjacent bit line implants. Above the top dielectric layer 40 are a plurality of parallel, spaced apart, polysilicon word lines which are perpendicular to the bit line implants 36 and the channel regions 44. Each dielectric memory cell is defined by an intersection of a word line 42 and a channel region 44.

A challenge with the planar structure of FIG. 1b is that each bit line has a high resistance. It has been empirically determined that using present fabrication technologies that a bit line has on the order of 100 Ohms of resistance per bit line. As such, accurate control of bit line voltage at a particular cell requires that the cell be relatively close to a contact—as close as within 16 word lines. Placing this quantity of contacts within the core region of a memory array increases the overall dimension of an array of cells.

Consequently, in accordance with a generalized industry need to reduce the size of memory arrays, a specific need exists for a fabrication process for fabricating planar structure charge trapping dielectric memory cells that provides decreasing bit line resistance such that fewer contacts are required within the core region of the array.

SUMMARY OF THE INVENTION

A first aspect of the present invention is to provide a method of fabricating a planar architecture charge trapping dielectric memory cell array with rectangular gates and reduced bit line resistance.

The method comprises: a) fabricating a tunnel dielectric layer on a surface of a substrate; b) fabricating a charge trapping dielectric over the tunnel dielectric (the charge trapping dielectric may comprise a charge trapping nitride compound layer adjacent to the tunnel layer and may include a top dielectric layer over the nitride compound layer); c) depositing a polysilicon layer over the top dielectric layer of the charge trapping dielectric; d) applying a word line mask over the polysilicon layer to mask linear word lines in a first direction and to expose trench regions there between; e) etching the polysilicon layer to expose the charge trapping dielectric in the trench regions; f) applying a bit line mask over the polysilicon layer to mask gates in a second direction perpendicular to the first direction and to expose bit line regions there between; g) etching the polysilicon layer and the charge trapping dielectric layer to expose the tunnel dielectric layer in the bit line regions; h) implanting an impurity into the substrate within the bit line regions to form buried bit lines; i) fabricating insulating spacers on exposed sidewalls of the polysilicon layer and the charge trapping layer; j) removing the tunnel dielectric layer to expose the substrate between insulating spacers in the bit line regions: j) fabricating a conductor on the exposed substrate in the bit line regions; and k) fabricating word line conductors that electrically couple remaining portions of the polysilicon layer (e.g. the rectangular gates) along word lines in the first direction.

The method may further comprise applying an insulator to fill the trench regions formed by each of the steps of: (i) etching the polysilicon layer to expose the charge trapping dielectric in the trench regions; and (ii) etching the polysilicon layer and the charge trapping dielectric layer to expose the tunnel dielectric layer in the bit line regions. And, the step of applying the insulator may follow the step of fabricating a conductor on the exposed substrate. In such case, the step of fabricating word line conductors that electrically couple remaining portions of the polysilicon layer along word lines in the first direction may comprise fabricating such word line conductors over the insulator between the gates.

In an alternative embodiment, the method may further comprise: a) applying an insulator over the exposed charge trapping dielectric following the step of etching the polysilicon layer to expose the charge trapping dielectric in the trench regions to fill the trench regions within the polysilicon layer formed by the step of etching. Thereafter, the step of applying a bit line mask over the polysilicon layer to mask gates in a second direction perpendicular to the first direction and to expose bit line regions there between further comprises applying the bit line mask over the insulator within the trench regions. Further, the step of etching the polysilicon layer and the charge trapping dielectric layer to expose the tunnel dielectric layer in the bit line regions further comprises etching the insulator within the trench regions.

For a better understanding of the present invention, together with other and further aspects thereof, reference is made to the following description, taken in conjunction with the accompanying drawings. The scope of the invention is set forth in the appended clams.

BRIEF DESCRIPTION OF THE DRAWINGS

FIG. 3 is a flow chart representing exemplary processing steps for fabricating the array of charge trapping dielectric memory cells of FIG. 2a;

DESCRIPTION OF THE PREFERRED EMBODIMENTS

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2A:
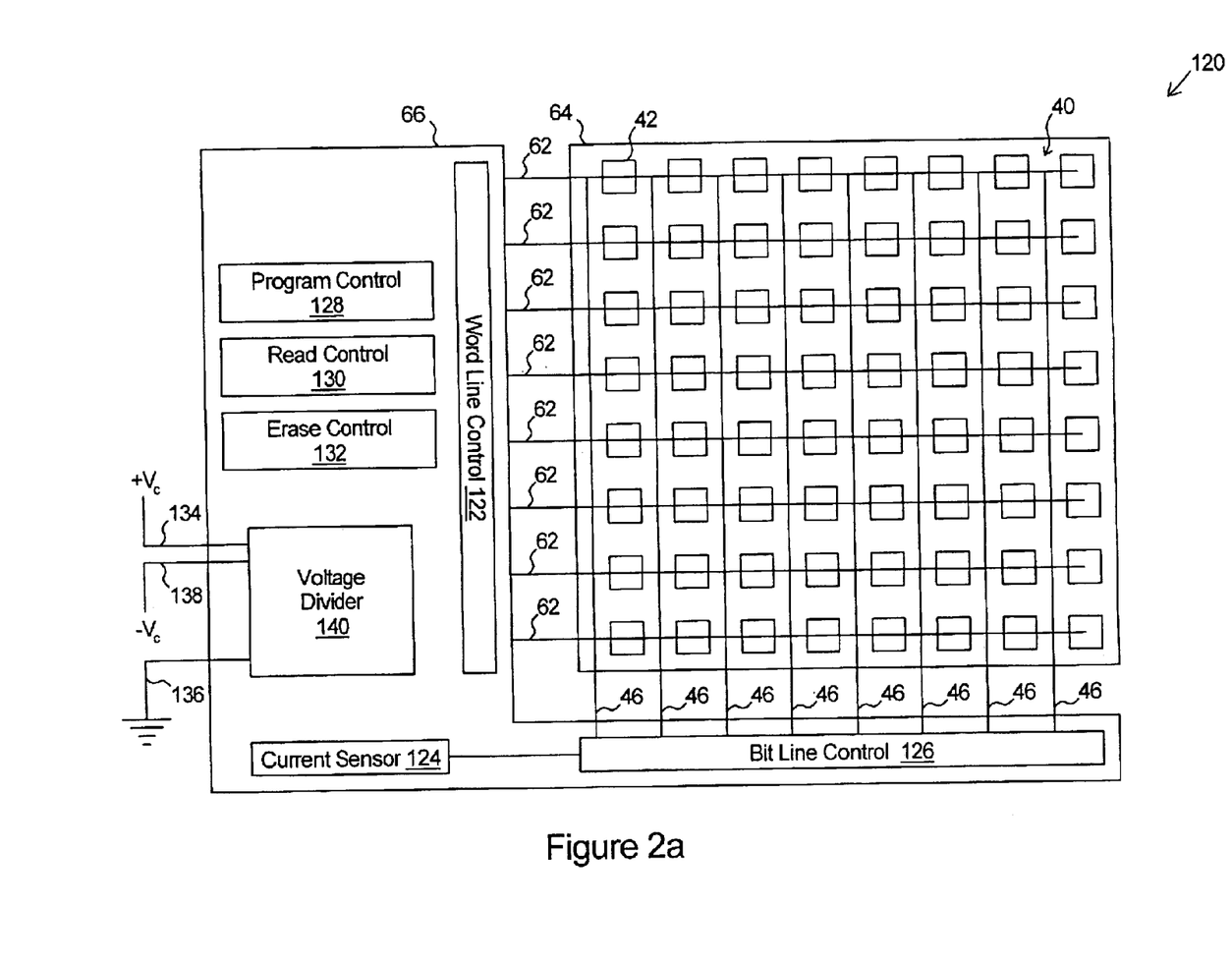
FIG. 2a is a block diagram representing a charge trapping dielectric memory cell circuit in accordance with one embodiment of the present invention.

FIG. 2a depicts an exemplary embodiment of a dual bit dielectric memory cell array circuit 120 in block diagram form. The circuit 120 comprises an array 40 of dual bit dielectric memory cells 42 fabricated in a core region 64 of a substrate and control circuits fabricated in a periphery region 66 of the substrate. The array 40 of dual bit dielectric memory cells 42 in the core region 48 is arranged in a matrix format with horizontal rows of word lines 62 and vertical columns defined by channel regions between alternating bit line diffusions 46 within the substrate. Each cell 42 within a column shares the same two bit lines 46 that are adjacent to, and form a junction with, each cell's channel region. Each cell 42 within a row shares the same word line 62 with other cells 42 in the row.

The control circuits within the periphery region may comprise transistor gate logic circuits that include a word line control circuit 122, a bit line control circuit 126, a current sensor 124, a program control circuit 128, a read control circuit 130, an erase control circuit 132, a voltage divider circuit 140, a coupling to a positive operating power source (Vc) 134, a coupling to a negative operating power source (−Vc) 138, and a coupling to a ground 136.

In operation, the array control circuits operate to selectively couple each word line 62 and each bit line 46 to a voltage provided by the voltage divider 140 or to ground (or to isolate the word line 62 or bit line 46 from all voltage sources and ground such that is potential is effected only by electrical interaction with other structure of the array 40). The coupling is in such a manner that each charge trapping region memory cell 42 within the array 40 can be erased, selectively programmed (with one or two bits of data), and selectively read. The array control circuit also operates to couple a selected bit line to the current sensor 124 such that a current on the selected bit line may be measured to indicate the programmed state of a selected memory cell 42.

Figure 2B:
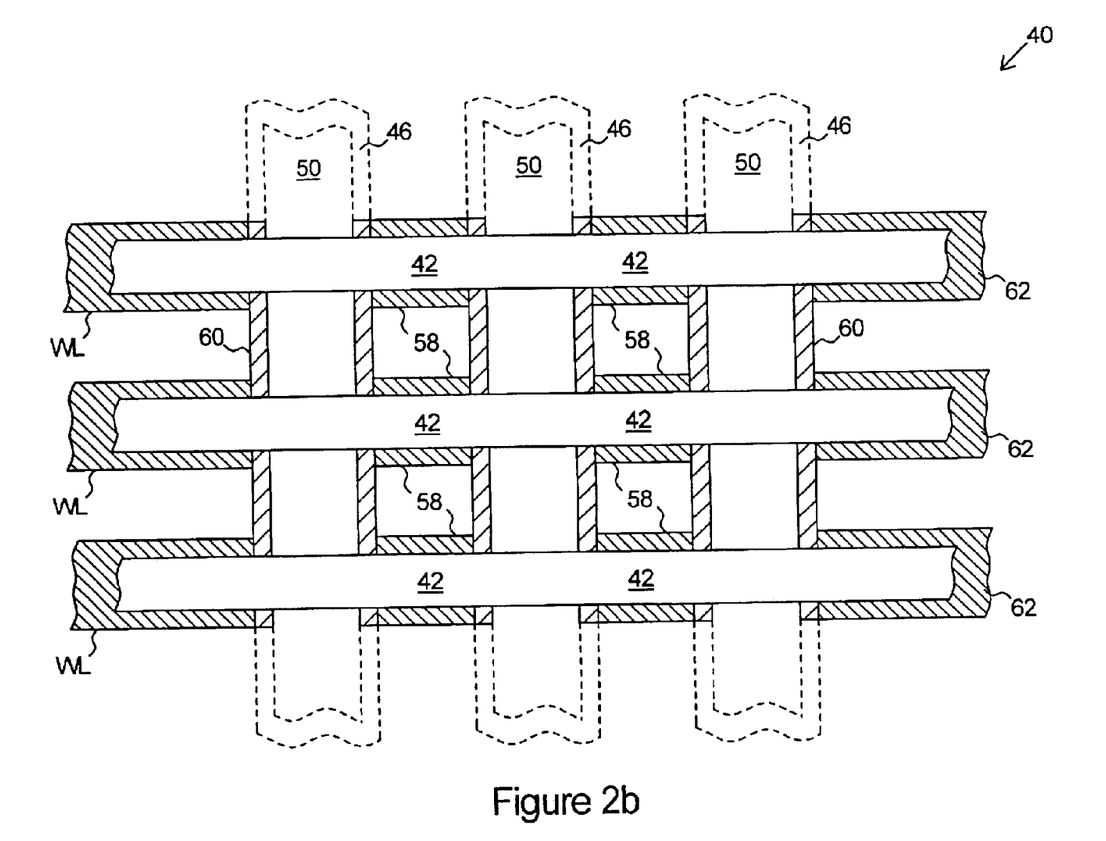
FIG. 2b is a plan view of a rectangular gate planar architecture charge trapping dielectric memory cell array in accordance with one embodiment of the present invention.
Figure 2C:
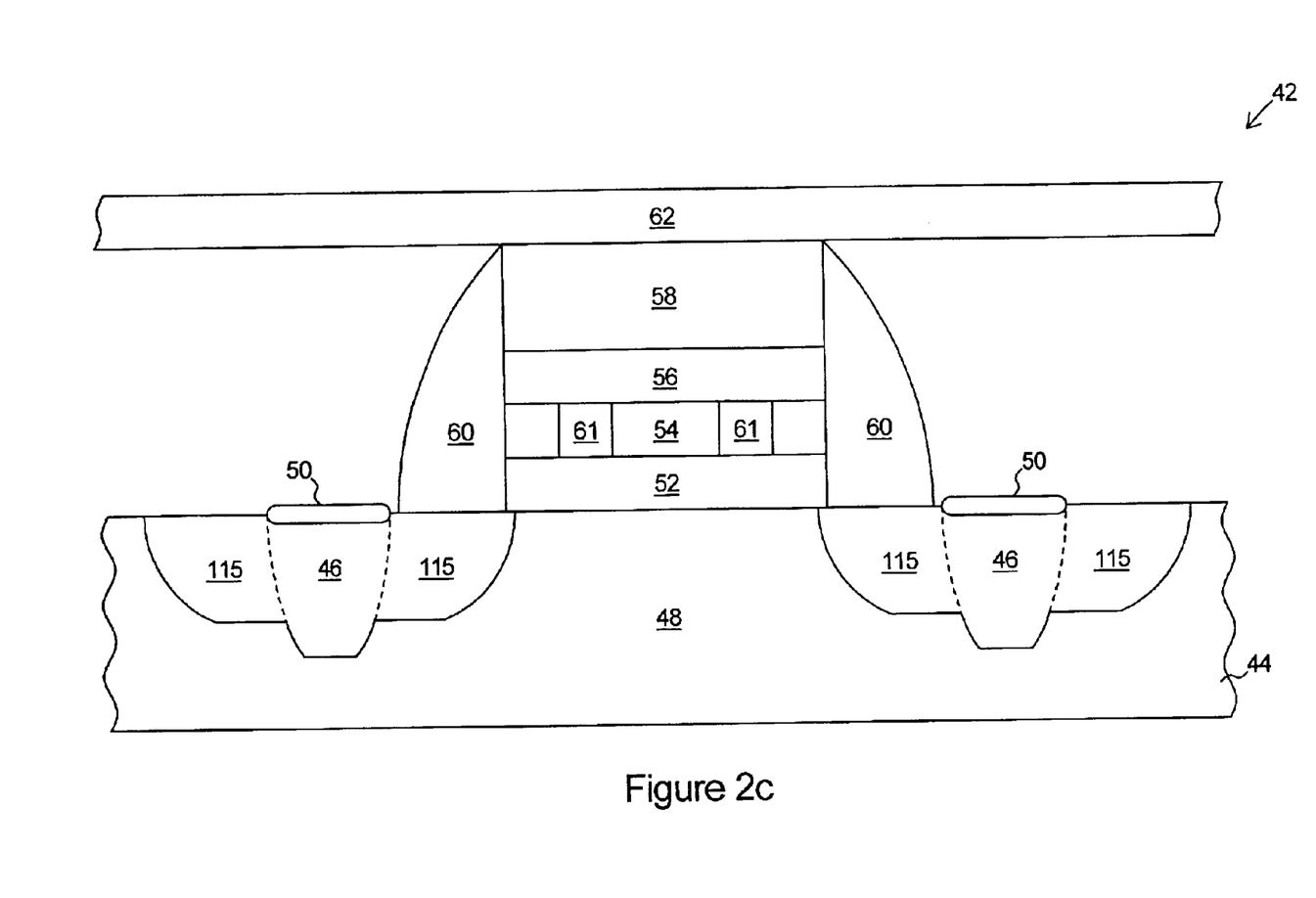
FIG. 2c is a cross section view of a charge trapping dielectric cell of FIG. 2a in accordance with one embodiment of the present invention.

FIG. 2b shows an exemplary plan view of an array 40 of charge trapping dielectric memory cells 42 and FIG. 2c shows a cross section view of one such charge trapping dielectric memory cell 42.

Referring initially to FIG. 2c, the memory cell 42 is fabricated on a crystalline semiconductor substrate 44, such as silicon, which is lightly doped with a hole donor impurity, such as boron, such that the substrate is a lightly doped p-type conductivity semiconductor.

Within the substrate 44 are a plurality of spaced apart and parallel bit lines which define a plurality of channel regions 48 there between. Each bit line region 46 is formed by implanting the bit line region 46 with an electron donor impurity, such as arsenic, to create a n-type conductivity semiconductor in the bit line region 46. On the top portion of each bit line region 46 is a conductor 50. Each bit line region 46 forms a source region or a drain region for the memory cell 42 that is defined by the two bit lines 46 and the channel region 48 there between.

Above the channel region 48 of the memory cell 42 is a first insulating barrier, or tunnel layer 52, which may comprise silicon dioxide. The thickness of the tunnel layer 52 may be within a range of about 50 to about 150 angstroms. An embodiment with a more narrow bracket includes a tunnel layer 54 thickness within a range of about 60 to about 90 angstroms and even narrower yet, a tunnel layer 54 with a thickness of about 70 to about 80 angstroms.

On the surface of the tunnel layer 52 is a charge trapping dielectric layer 54 that includes one or more charge trapping regions 61 for storing a neutral charge representing an un-programmed state or a negative charge representing a programmed state. The charge trapping layer 54 may comprise a compound with suitable charge trapping properties such as a charge trapping sheet density on the order of $3 \times 10^6$ electrons per square centimeter and a thickness such that non-uniformities in the charge trapping dielectric layer 54 thickness do not detrimentally effect operation and the thickness is adequate to block hydrogen diffusion.

In the exemplary embodiment, suitable charge trapping dielectric layer 54 may be a nitride compound such as a nitride compound selected from the group consisting of $Si_2N_4$, $Si_3N_4$ and $SiO_xN_4$. Further, in the exemplary embodiment, the charge trapping dielectric layer 54 may have a thickness on the order of 20 to 100 angstroms, or, an embodiment with a more narrow range may include a thickness on the order of 30 to 50 angstroms.

On the surface of the charge trapping dielectric layer 54 is a top dielectric layer 56. The top dielectric layer 56 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 56 is silicon dioxide, the layer 56 may have a thickness on the order of 60 to 100 angstroms. Alternatively, if the top dielectric layer 56 is a high K material, its electrical thickness may be on the order of 60 to 100 angstroms while its physical thickness may be within a range of about 70 to 130 angstroms. An embodiment with a more narrow bracket includes a top dielectric layer 56 with a physical thickness within a range of about 80 to about 120 angstroms and even narrower yet, a top dielectric layer 56 with a physical thickness of about 90 to about 100 angstroms.

On the surface of the top dielectric layer 56 is a gate electrode 58. The gate electrode 58 may be a semiconductor such a polycrystalline silicon. On each side of each of the gate electrode 58, the top dielectric layer 56, the charge trapping dielectric layer 54, and the tunnel dielectric layer 52 is a side wall insulating spacer 60. In the exemplary embodiment, the insulating spacer 60 may be formed of a nitride compound. The thickness of the insulating spacer 60 is of a thickness to prevent any current flow from the gate electrode 58 or the charge trapping dielectric layer 56 to any of the bit line region 46, the conductor 50, and any electrodes that may connect between the conductor 50 and metal layers (not shown) above the gate electrode 58.

Extending across the top surface of the gate electrode 58, in a direction that is perpendicular to the direction of the bit line regions 46 is a word line conductor 62. The word line conductor 63 may be any metal that will electrically couple to the gate electrode 58.

Referring to the plan view of FIG. 2b, it can be seen that each memory cell 42 is formed at the intersection of a word line conductor 62 and the channel region that is defined by two adjacent and spaced apart bit lines 46. For purposes of clarity, each word line conductor 62 is shown narrower than the rectangular gate electrode 58 such that each rectangular gate electrode 58 is visible in FIG. 2a. However, it should be appreciated that the word line conductor 62 may have a width equal to the width of the gate electrode 58. It should also be appreciated that each bit line region 46 and each bit line conductor 50 is shown as a dashed-line indicating that it is spaced below each word line conductor 62 (as shown in FIG. 2b) such that no electrical coupling exists between the word line conductor 62 and the bit line conductor 50.

The advantage of the above described structure over known structures is that the bit line conductor 50, with a lower resistance than the bit line regions 46, is linearly coupled along the entire length of the bit line region 46 thereby enabling potential of the bit line region 46 to remain relatively constant across the whole length of the bit line without potential drop due to resistance of the bit line region 46.

Figure 3A:
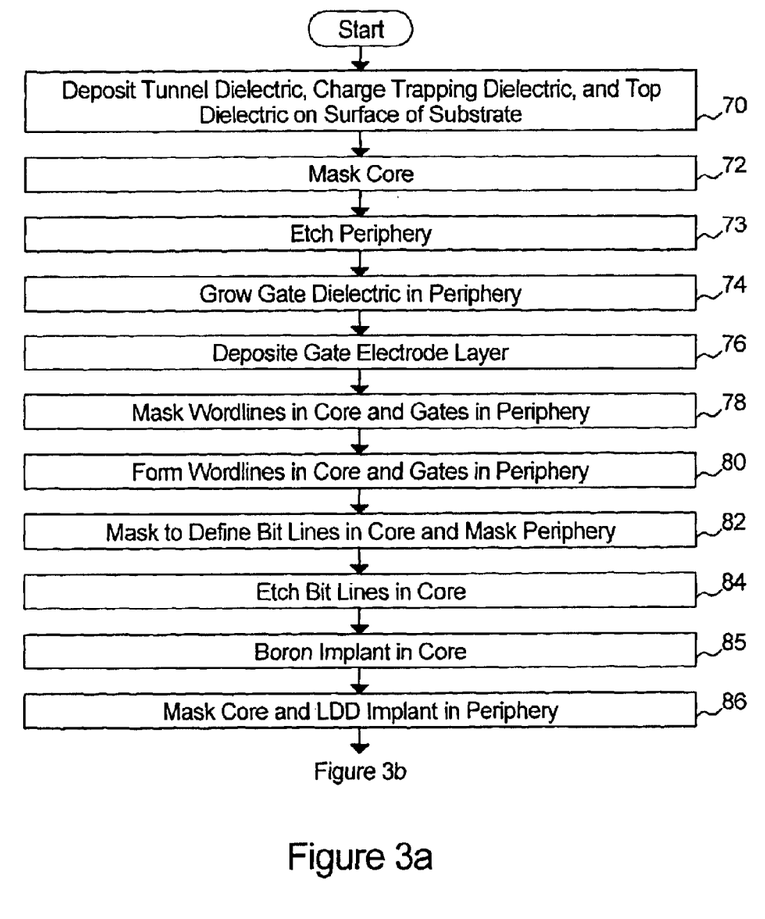
Figure 3B:
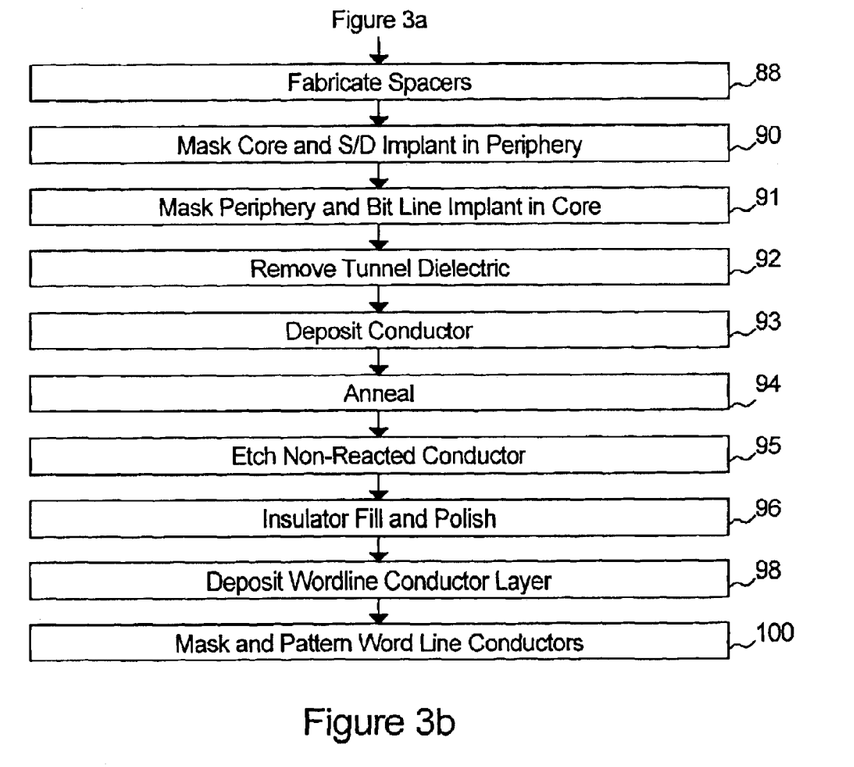

FIG. 3 represents a flow chart of exemplary processing steps for fabricating the memory cell array 40 and FIG. 4a through 4i represent cross sectional views of a portion of the array 40 during selected processing steps.

Figure 4A:
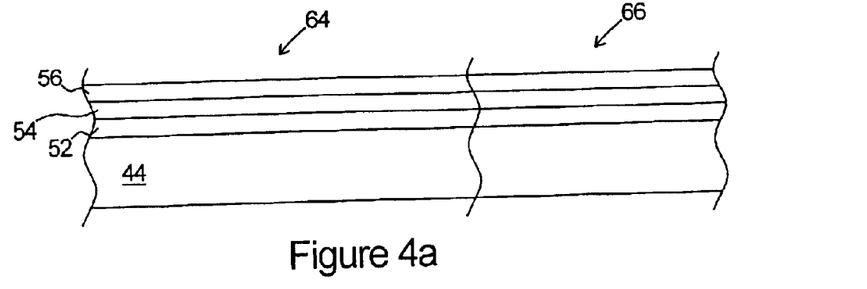
FIGS. 4a–4k represent cross section views of a portion of the array of charge trapping dielectric memory cells of FIG. 2a at selected processing steps during fabrication.

Step 70, of the flowchart of FIG. 3, represents fabricating the tunnel dielectric layer 52 across the entire surface of the wafer 44 (including both the a core region 64 and a periphery region 66), fabricating the charge trapping dielectric layer 54 across the entire surface of the tunnel dielectric layer 52, and fabricating the top dielectric layer 56 across the entire surface of the charge trapping dielectric layer 54, all as depicted in FIG. 4a.

Figure 4B:
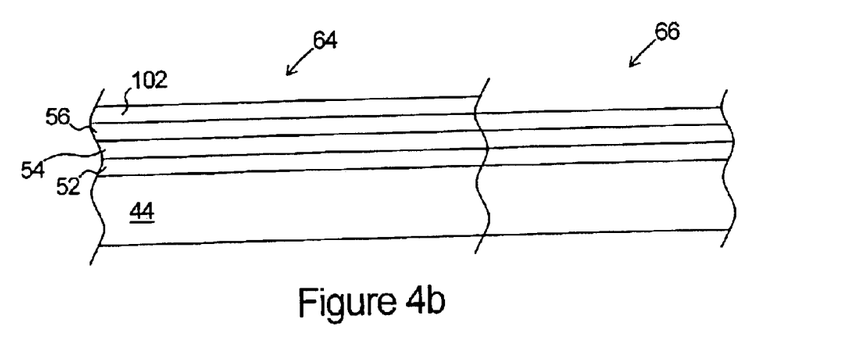

Step 72 represents applying a photoresist mask 102 over surface of the top dielectric layer 56 in the core region 64 while exposing the periphery region 66 as depicted in FIG. 4b. More specifically, step 72 represents applying a layer of photoresist across the entire surface of the top dielectric layer 66 using known spin-on techniques, exposing the photoresist to patterned illumination to define the mask over the core region 64, and developing the photoresist to expose the top dielectric layer 64 in the periphery region 66 while a photoresist mask 102 remains over the core region 64.

Figure 4C:
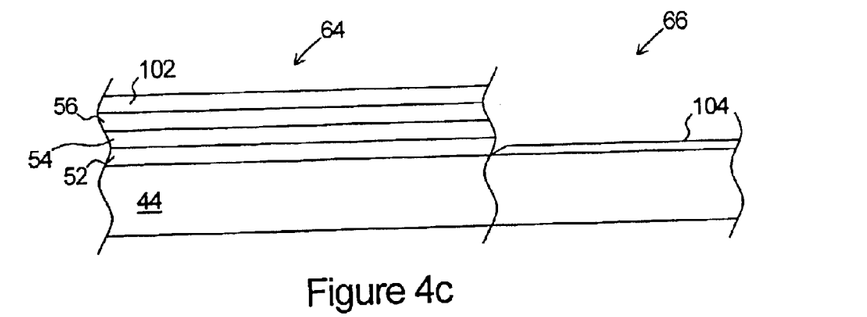

Step 73 represents an etching steps that remove the top dielectric layer 56 and the charge trapping dielectric layer 54 in the exposed periphery 66 as is depicted in FIG. 4c.

Step 74 represents growing a gate dielectric layer 104 in the periphery region 66. In the exemplary embodiment, the gate oxide layer 76 is thermally grown to a calibrated thickness within a range of 100 angstroms and 150 angstroms such that it adequately functions as a gate oxide for the transistors to be fabricated within the periphery region 66. The gate dielectric layer 104 is depicted in FIG. 4c. Following growth of the gate dielectric layer 104, the photoresist mask 102 is removed.

Figure 4D:
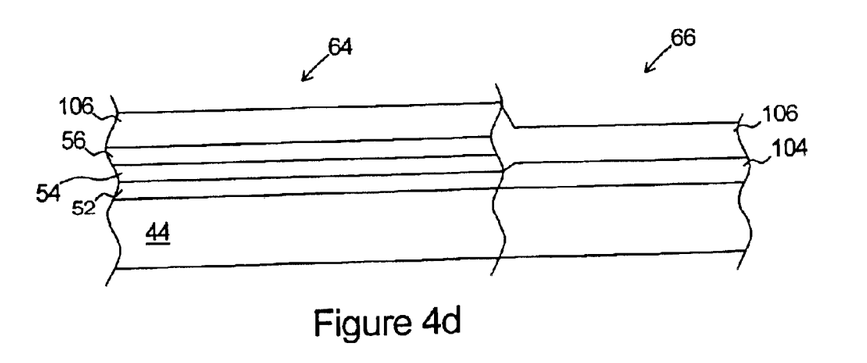
Figure 4E:
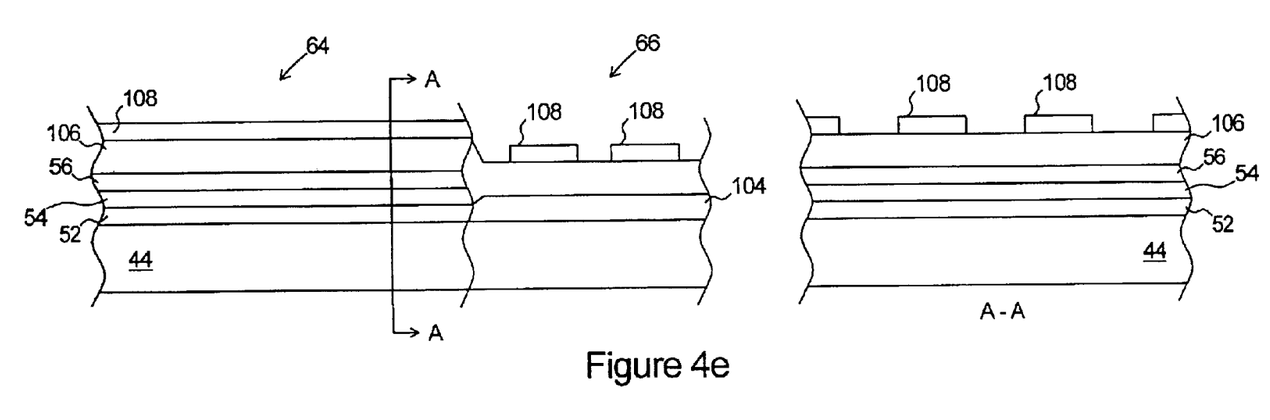

Step 76 represents depositing a gate electrode layer 106 across the entire surface including the top dielectric layer 56 in the core region and the gate oxide layer 104 in the periphery as is depicted in FIG. 4d. In the exemplary embodiment, the gate electrode layer 106 is polysilicon that is deposited using known deposition techniques.

Figure 4F:
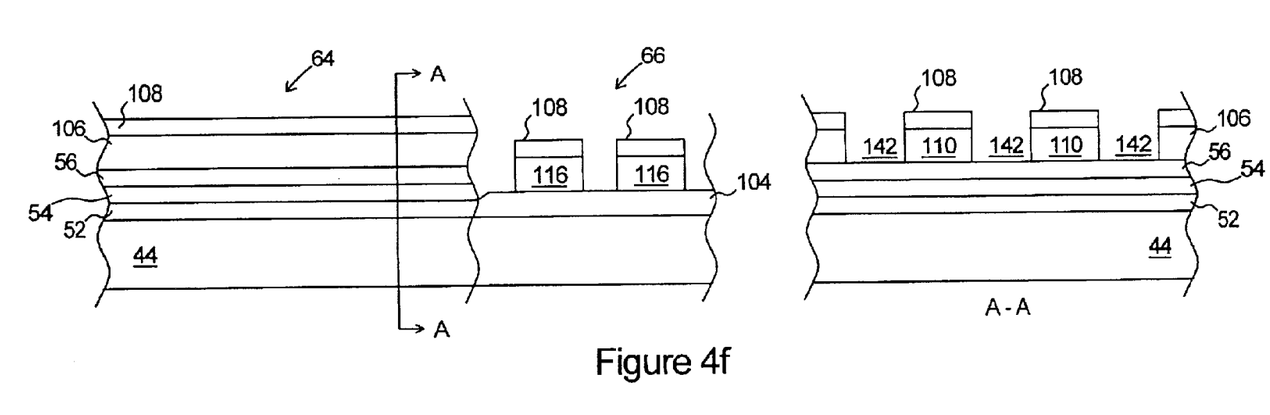

Step 78 represents applying and patterning a mask 108 over the gate electrode layer 106 to mask word lines 110 in the core region 64 (while exposing trench regions 142) and to mask the periphery region 66 as is depicted in FIG. 4f. The mask 108 may comprise an antireflective coating over the gate electrode layer 106 and a photoresist layer over the antireflective coating.

Step 80 represents etching the gate electrode layer 106 to define word lines 110 within the gate electrode layer 106 within the core region 64 as depicted in FIG. 4f. Thereafter, the mask 108 may be removed.

Figure 4G:
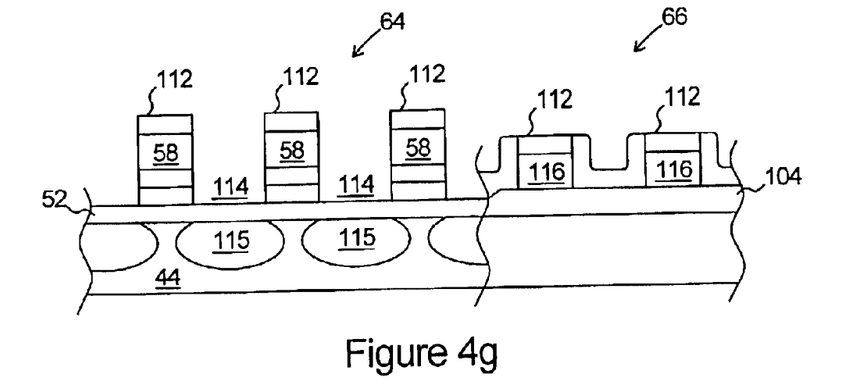
Figure 4H:
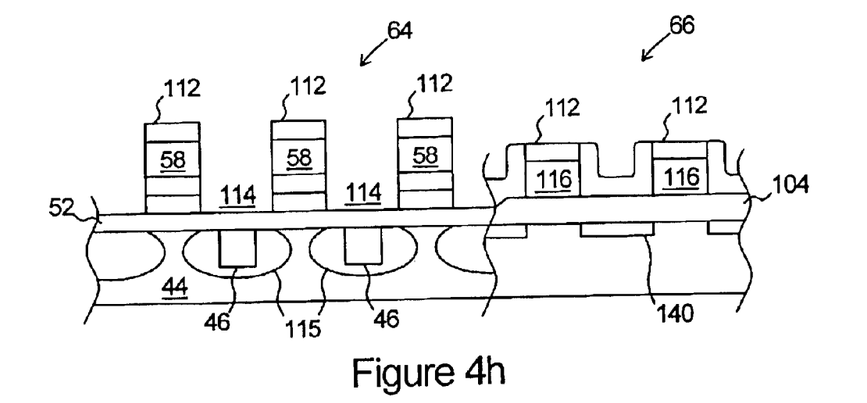

Step 82 represents applying and patterning a mask 112 over the remaining gate electrode layer 106 to define bit lines 114 in the core region 64 and to define gates 116 within the periphery region 66 as is depicted in FIG. 4g. The mask 112, similar to mask 108, may comprise an antireflective coating over the gate electrode layer 106 and a photoresist layer over the antireflective coating.

Step 84 represents etching the gate electrode layer 106 to define the bit lines (and gates 58) 114 within the gate electrode layer 106 within the core region 64 and to define the gates 116 within the gate electrode layer 116 within the periphery region 66 as depicted in FIG. 4g. Thereafter, the mask 112 may be removed.

Step 86 represents a low dose implant of an electron donor impurity, such as arsenic, to form lightly doped source and drain extension regions within the periphery region 66. Thereafter, at step 88, side wall spacers are fabricated on the sides of the gates 116 in the periphery region and on the sides of the charge trapping dielectric 54, the top dielectric 56, and the gate 58 in the core region 64. The side wall spacers may be formed using known techniques of applying an insulator, such as a nitride compound, over the entire surface and performing an isotropic etch to remove the insulator form horizontal surfaces while the side wall spacers remaining. Thereafter, at step 90, an electron donor impurity is implanted to from the bit lines 114 within the core region 64 and to form the source and drain regions 140 within the periphery region 66. The lightly doped source and drain extension regions, the side wall spacers, the bit lines, and the source and drain regions are all depicted in FIG. 4h.

Figure 4I:
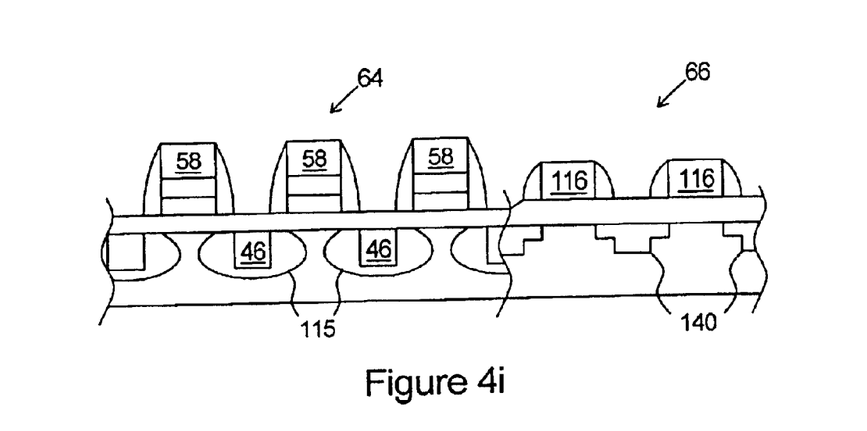

Step 92 represents removing the tunnel dielectric using a known washing process and step 94 represents depositing a conductor such as CoSi on the top surface of the exposed bit lines. Thereafter, step 96 represents filling the bit lines with an insulator material such as a nitride compound and polishing to expose the top surface of each gate 58 as depicted in FIG. 4i.

Figure 4J:
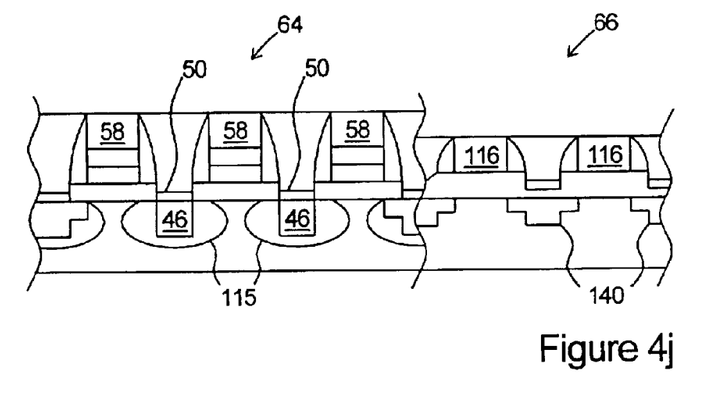
Figure 4K:
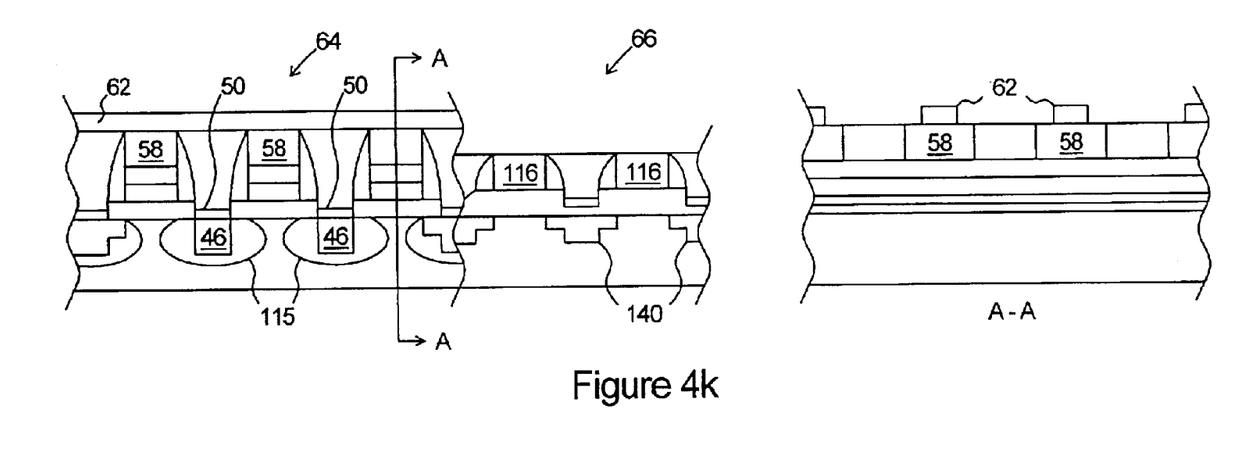

Step 98 represents depositing a word line conductor layer 118 on the polished surface (e.g. over the rectangular gates and the insulator there between) and step 100 represents masking, patterning, and etching the word line conductor layer 118 to define the word line conductors 62 within the core region 64 and removing the word line conductor layer completely from the periphery region 66. The remaining word line conductors 62 are depicted in FIG. 4j.

Figure 5:
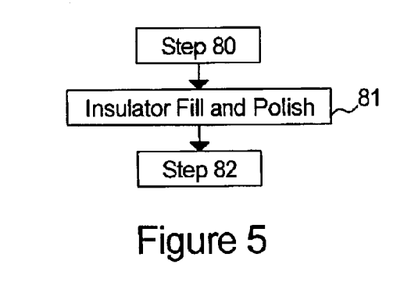
FIG. 5 is a partial flow chart representing an exemplary processing step for an alternative embodiment of the present invention.

It should be appreciated that the above described process provides for two etch cycles at the intersection of the word line etch at step 80 and the bit line etch at step 84. It also requires that the bit line mask at step 82 be applied over an uneven surface as depicted in FIG. 4f. To alleviate both of these potential problems, an alternative embodiment may include step 81 as depicted in FIG. 5. Step 81 is performed between steps 80 and 82 of FIG. 3 and comprises depositing an insulator, such as a nitride compound, on the surface, and polishing, to fill the spaces formed between the word lines 110. Such structure following step 81 is depicted in FIG. 6. There after the remaining processing steps would be similar with minor changes to accommodate the addition nitride added at step 81. For example, the etch of the bit lines at step 82 in this sub embodiment may represent multiple sub step etching processes first with an etch chemistry for etching the polysilicon and second with an etch chemistry for etching the insulator added at step 81.

Although this invention has been shown and described with respect to certain preferred embodiments, it is obvious that equivalents and modifications will occur to others skilled in the art upon the reading and understanding of the specification. For example, Although the cells of the array are shown formed on the silicon substrate, it should be appreciated that the teachings of this invention may be applied to other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. A method of fabricating a planar architecture charge trapping dielectric memory cell array with rectangular gates, the method comprising:

fabricating a tunnel dielectric layer on a surface of a substrate;

fabricating a charge trapping dielectric over the tunnel dielectric;

depositing a polysilicon layer over the charge trapping dielectric;

applying a word line mask over the polysilicon layer to mask linear word lines in a first direction and to expose trench regions there between;

etching the polysilicon layer to expose the charge trapping dielectric in the trench regions;

applying a bit line mask over the polysilicon layer to mask gates in a second direction perpendicular to the first direction and to expose bit line regions there between;

etching the polysilicon layer and the charge trapping dielectric layer to expose the tunnel dielectric layer in the bit line regions;

fabricating insulating spacers on exposed sidewalls of the polysilicon layer and the charge trapping layer;

removing the tunnel dielectric layer to expose the substrate between insulating spacers in the bit line regions;

fabricating a conductor on the exposed substrate in the bit line regions; and fabricating word line conductors that electrically couple remaining portions of the polysilicon layer along word lines in the first direction.

2. The method of claim 1, further comprising:

applying an insulator to fill the trench regions formed by each of the steps of: (i) etching the polysilicon layer to expose the charge trapping dielectric in the trench regions; and (ii) etching the polysilicon layer and the charge trapping dielectric layer to expose the tunnel dielectric layer in the bit line regions; the step of applying the insulator following the step of fabricating a conductor on the exposed substrate; and the step of fabricating word line conductors that electrically couple remaining portions of the polysilicon layer along word lines in the first direction comprises fabricating such word line conductors over the insulator between the gates.

3. The method of claim 1, wherein the charge trapping dielectric comprises a nitride compound layer adjacent to the tunnel layer and a top insulator layer over the nitride layer and adjacent to the polysilicon layer.

4. The method claim 1, further comprising as step of implanting an impurity into the substrate within the bit line regions to form buried bit lines, such step occurring between the steps of: (i) etching the polysilicon layer and the charge trapping dielectric layer to expose the tunnel dielectric layer in the bit line regions; and (ii) fabricating a conductor on the exposed substrate in the bit line regions.

5. The method of claim 4, wherein the step of implanting an impurity into the substrate within the bit line regions to form buried bit lines occurs between the steps of: (i) etching the polysilicon layer and the charge trapping dielectric layer to expose the tunnel dielectric layer in the bit line regions; and (ii) fabricating insulating spacers on exposed sidewalls of the polysilicon layer and the charge trapping layer.

6. The method of claim 4, wherein the step of implanting an impurity into the substrate within the bit line regions to form buried bit lines occurs between the steps of: (i) fabricating insulating spacers on exposed sidewalls of the polysilicon layer and the charge trapping layer; and (ii) fabricating a conductor on the exposed substrate in the bit line regions.

7. The method of claim 1, further comprising:

applying an insulator over the exposed charge trapping dielectric following the step of etching the polysilicon layer to expose the charge trapping dielectric in the channel regions to fill the trench regions within the polysilicon layer formed by the step of etching; and wherein the step of applying a bit line mask over the polysilicon layer to mask gates in a second direction perpendicular to the first direction and to expose bit line regions there between further comprises applying the bit line mask over the insulator within the trench regions; and the step of etching the polysilicon layer and the charge trapping dielectric layer to expose the tunnel dielectric layer in the bit line regions further comprises etching the insulator within the trench regions.

8. The method of claim 7, further comprising:

applying an insulator to fill the trench regions formed by each of the steps of: (i) etching the polysilicon layer to expose the charge trapping dielectric in the channel regions; and (ii) etching the polysilicon layer and the charge trapping dielectric layer to expose the tunnel dielectric layer in the bit line regions; the step of applying the insulator following the step of fabricating a conductor on the exposed substrate; and the step of fabricating word line conductors that electrically couple remaining portions of the polysilicon layer along word lines in the first direction comprises fabricating such word line conductors over the insulator between the gates.

9. The method of claim 7, wherein the charge trapping dielectric comprises a nitride compound layer adjacent to the tunnel layer and a top insulator layer over the nitride layer and adjacent to the polysilicon layer.

10. The method of claim 7, further comprising as step of implanting an impurity into the substrate within the bit line regions to form buried bit lines, such step occurring between the steps of: (i) etching the polysilicon layer and the charge trapping dielectric layer to expose the tunnel dielectric layer in the bit line regions; and (ii) fabricating a conductor on the exposed substrate in the bit line regions.

11. The method of claim 10, wherein the step of implanting an impurity into the substrate within the bit line regions to form buried bit lines occurs between the steps of: (i) etching the polysilicon layer and the charge trapping dielectric layer to expose the tunnel dielectric layer in the bit line regions; and (ii) fabricating insulating spacers on exposed sidewalls of the polysilicon layer and the charge trapping layer.

12. The method of claim 10, wherein the step of implanting an impurity into the substrate within the bit line regions to form buried bit lines occurs between the steps of: (i) fabricating insulating spacers on exposed sidewalls of the polysilicon layer and the charge trapping layer; and (ii) fabricating a conductor on the exposed substrate in the bit line regions.

13. A method of fabricating a planar architecture charge trapping dielectric memory cell circuit with square gate memory cells, the method comprising:

fabricating an oxide layer on a surface of a substrate;

fabricating a charge trapping dielectric over the tunnel dielectric;

fabricating a mask over the charge trapping dielectric to define and mask a core region and define and expose a periphery region;

etching the charge trapping dielectric to remove the charge trapping dielectric in the periphery region to expose the oxide layer;

fabricating a gate oxide layer in the periphery region by growing additional oxide on the oxide layer in the periphery region;

simultaneously depositing a polysilicon layer over the charge trapping dielectric in the core region and over the gate oxide layer in the periphery region;

applying a word line mask over the polysilicon layer to mask linear word lines in a first direction and to expose trench regions there between within the core region and to mask the periphery region;

etching the polysilicon layer to expose the charge trapping dielectric in the trench regions;

applying a bit line mask over the polysilicon layer to mask "gates" in a second direction perpendicular to the first direction and to expose bit line regions there between within the core region and to mask gates and expose source/drain regions within the periphery;

etching the polysilicon layer and the charge trapping dielectric layer to expose the tunnel dielectric layer in the bit line regions and to expose the gate oxide in the source/drain regions;

fabricating insulating spacers on exposed sidewalls of the polysilicon layer and the charge trapping layer in both the core region and the periphery region;

simultaneously removing the tunnel dielectric layer to expose the substrate between insulating spacers in the bit line regions and removing the gate oxide layer to expose the substrate in the source/drain regions;

fabricating a conductor on the exposed substrate in the bit line regions and in the source/drain regions; and fabricating word line conductors that electrically couple remaining portions of the polysilicon layer along word lines in the first direction.

14. The method of claim 13, further comprising:

applying an insulator to fill the trench regions formed by each of the steps of: (i) etching the polysilicon layer to expose the charge trapping dielectric in the channel regions; and (ii) etching the polysilicon layer and the charge trapping dielectric layer to expose the tunnel dielectric layer in the bit line regions; the step of applying the insulator following the step of fabricating a conductor on the exposed substrate; and the step of fabricating word line conductors that electrically couple remaining portions of the polysilicon layer along word lines in the first direction comprises fabricating such word line conductors over the insulator between the gates.

15. The method of claim 13, wherein the charge trapping dielectric comprises a nitride compound layer adjacent to the tunnel layer and a top insulator layer over the nitride layer and adjacent to the polysilicon layer.

16. The method of claim 13, further comprising as step of implanting an impurity into the substrate within the bit line regions to form buried bit lines, such step occurring between the steps of: (i) etching the polysilicon layer and the charge trapping dielectric layer to expose the tunnel dielectric layer in the bit line regions; and (ii) fabricating a conductor on the exposed substrate in the bit line regions.

17. The method of claim 16, wherein the step of implanting an impurity into the substrate within the bit line regions to form buried bit lines occurs between the steps of: (i) etching the polysilicon layer and the charge trapping dielectric layer to expose the tunnel dielectric layer in the bit line regions; and (ii) fabricating insulating spacers on exposed sidewalls of the polysilicon layer and the charge trapping layer.

18. The method of claim 16, wherein the step of implanting an impurity into the substrate within the bit line regions to form buried bit lines occurs between the steps of: (i) fabricating insulating spacers on exposed sidewalls of the polysilicon layer and the charge trapping layer; and (ii) fabricating a conductor on the exposed substrate in the bit line regions.

19. The method of claim 13, further comprising:

applying an insulator over the exposed charge trapping dielectric following the step of etching the polysilicon layer to expose the charge trapping dielectric in the channel regions to fill the trench regions within the polysilicon layer formed by the step of etching; and wherein the step of applying a bit line mask over the polysilicon layer to mask "gates" in a second direction perpendicular to the first direction and to expose bit line regions there between and to mask gates and expose source/drain regions within the periphery further comprises applying the bit line mask over the insulator within the trench regions; and the step of etching the polysilicon layer and the charge trapping dielectric layer to expose the tunnel dielectric layer in the bit line regions and to expose the gate oxide in the source/drain regions further comprises etching the insulator within the trench regions.

20. The method of claim 19, further comprising:

applying an insulator to fill the trench regions formed by each of the steps of: (i) etching the polysilicon layer to expose the charge trapping dielectric in the channel regions; and (ii) etching the polysilicon layer and the charge trapping dielectric layer to expose the tunnel dielectric layer in the bit line regions; the step of applying the insulator following the step of fabricating a conductor on the exposed substrate; and the step of fabricating word line conductors that electrically couple remaining portions of the polysilicon layer along word lines in the first direction comprises fabricating such word lien conductors over the insulator between the gates.

21. The method of claim 19, wherein the charge trapping dielectric comprises a nitride compound layer adjacent to the tunnel layer and a top insulator layer over the nitride layer and adjacent to the polysilicon layer.

22. The method of claim 19, further comprising as step of implanting an impurity into the substrate within the bit line regions to form buried bit lines, such step occurring between the steps of: (i) etching the polysilicon layer and the charge trapping dielectric layer to expose the tunnel dielectric layer in the bit line regions; and (ii) fabricating a conductor on the exposed substrate in the bit line regions.

23. The method of claim 22, wherein the step of implanting an impurity into the substrate within the bit line regions to form buried bit lines occurs between the steps of: (i) etching the polysilicon layer and the charge trapping dielectric layer to expose the tunnel dielectric layer in the bit line regions; and (ii) fabricating insulating spacers on exposed sidewalls of the polysilicon layer and the charge trapping layer.

24. The method of claim 22, wherein the step of implanting an impurity into the substrate within the bit line regions to form buried bit lines occurs between the steps of: (i) fabricating insulating spacers on exposed sidewalls of the polysilicon layer and the charge trapping layer; and (ii) fabricating a conductor on the exposed substrate in the bit line regions.

* * * * *